United States Patent
Hansen

(10) Patent No.: US 9,681,571 B2
(45) Date of Patent: Jun. 13, 2017

(54) ELECTRICAL CONNECTION BOX AND APPARATUS

(71) Applicant: WELLS MANUFACTURING, L.P., Fond Du Lac, WI (US)

(72) Inventor: David R. Hansen, Fond Du Lac, WI (US)

(*) Notice: Subject to any disclaimer, the term of this patent is extended or adjusted under 35 U.S.C. 154(b) by 11 days.

(21) Appl. No.: 14/627,946

(22) Filed: Feb. 20, 2015

(65) Prior Publication Data

US 2015/0245503 A1 Aug. 27, 2015

Related U.S. Application Data

(60) Provisional application No. 61/942,653, filed on Feb. 21, 2014.

(51) Int. Cl.
| | |
|---|---|
| H05K 5/00 | (2006.01) |
| H02G 3/08 | (2006.01) |
| H05K 7/14 | (2006.01) |
| H01R 13/04 | (2006.01) |
| H01R 13/11 | (2006.01) |

(52) U.S. Cl.
CPC .......... *H05K 7/1432* (2013.01); *H01R 13/04* (2013.01); *H01R 13/114* (2013.01); *H01R 2201/26* (2013.01)

(58) Field of Classification Search
None
See application file for complete search history.

(56) References Cited

U.S. PATENT DOCUMENTS

| | | | |
|---|---|---|---|
| 3,425,023 A | 1/1969 | Krol | |
| 3,601,750 A | 8/1971 | Mancini | |
| 4,169,643 A | 10/1979 | Gallagher | |
| 4,560,231 A | 12/1985 | Shirai | |
| 4,721,484 A * | 1/1988 | Sakamoto | H01R 13/113 439/842 |
| 4,733,465 A | 3/1988 | Tanaka | |
| 4,884,978 A | 12/1989 | Inaba | |
| 4,909,746 A * | 3/1990 | Scholz | H01R 12/523 439/74 |
| 4,941,851 A | 7/1990 | Hsueh | |
| 5,011,417 A | 4/1991 | Matsumoto | |
| 5,017,147 A | 5/1991 | Sugiyama | |
| 5,067,905 A | 11/1991 | Matsumoto | |
| 5,507,664 A | 4/1996 | Carmo | |
| 5,545,054 A | 8/1996 | Benes | |
| 5,628,656 A | 5/1997 | Macioce | |
| 5,759,053 A | 6/1998 | Sugiyama | |
| 7,128,616 B1 | 10/2006 | Orr et al. | |
| 7,238,056 B2 | 7/2007 | McCoy | |

(Continued)

*Primary Examiner* — Dimary Lopez Cruz
(74) *Attorney, Agent, or Firm* — Barnes & Thornburg LLP

(57) ABSTRACT

An electrical connection box includes a housing and a connector assembly coupled to the housing. The connector assembly includes sockets for receiving plugs from a motor vehicle. The housing is formed to include a cavity that is designed to house electronic circuitry. The connector assembly includes at least one socket and at least one connector positioned within the socket. The connector is configured to create an electrical connection with an electrical plug that is received in the socket to electrically couple components of the vehicle with the electronic circuitry and minimize a voltage loss across the electrical connection.

16 Claims, 10 Drawing Sheets

(56) References Cited

U.S. PATENT DOCUMENTS

| | | | |
|---|---|---|---|
| 7,965,510 B2 * | 6/2011 | Suzuki | B60K 6/365 |
| | | | 165/80.4 |
| 8,087,943 B2 * | 1/2012 | Stolze | H05K 3/3426 |
| | | | 439/83 |
| 8,217,265 B2 | 7/2012 | Shimizu | |
| 8,257,097 B2 | 9/2012 | Kawaguchi | |
| 8,383,940 B2 | 2/2013 | Yoshida | |
| 8,435,049 B2 | 5/2013 | Uchida | |
| 8,485,833 B2 * | 7/2013 | Kataoka | H01R 12/585 |
| | | | 439/79 |
| 2010/0044066 A1 | 2/2010 | Shimizu | |
| 2011/0186327 A1 | 8/2011 | Yoshida | |
| 2015/0016063 A1 * | 1/2015 | Higuma | H02M 7/003 |
| | | | 361/714 |

* cited by examiner

ELECTRICAL CONNECTION BOX AND APPARATUS

PRIORITY CLAIM

This application claims priority under 35 U.S.C. §119(e) to U.S. Provisional Application Ser. No. 61/942,653, filed Feb. 21, 2014, which is expressly incorporated by reference herein.

BACKGROUND

The present disclosure relates to the field of electrical connectors and systems. More particularly, the present disclosure relates to electrical connection boxes that can be used with voltage regulators or other electrical components. Conventionally known electrical connection boxes are mounted in a vehicle, such as a car or motorcycle, and electrically connected between a battery and vehicle electrical components, such as a lamp and a horn. Electrical connections used to allow wires to be connected to electrical connection boxes are generally made up of male and female connectors. The power loss across these connections is a function of the current flowing through the connector and the connections inherent contact resistance. Giving higher currents, this loss can be significant.

SUMMARY

In accordance with the present disclosure, an electrical connection box is configured to accept multiple electrical connections in a vehicle.

According to a first aspect of the present disclosure, an electrical apparatus for use with a vehicle includes a housing, electronic circuitry, and a connector assembly. The housing may be formed to include a cavity and the electronic circuitry may be positioned within the cavity of the housing. The electronic circuitry may include integrated components coupled to a circuit board. The connector assembly may be coupled to the housing to cover an opening into the cavity.

The connector assembly may include at least one socket and at least one connector positioned within the at least one socket. The at least one connector may be electrically coupled with the electronic circuitry. The at least one connector is configured to provide means for creating an electrical connection with an electrical plug that is received in the at least one socket to electrically couple components of the vehicle with the electronic circuitry and minimize a voltage loss across the electrical connection by minimizing electrical resistivity between the at least one connector and the plug.

In illustrative embodiments, the at least one connector may include at least a portion that is substantially square in cross-section.

In illustrative embodiments, corners of the substantially square cross-section may be rounded.

In illustrative embodiments, the at least one socket may include a first socket and a second socket spaced apart from the first socket. The at least one connector may include three input connectors positioned within the first socket and two output connectors positioned within the second socket to form a bus bar. Each of the input connectors and output connectors of the bus bar may be electrically coupled with the electronic circuitry.

In illustrative embodiments, the integrated components may form a combined voltage regulator and voltage rectifier circuit.

In illustrative embodiments, the input connectors may be configured to receive alternating current supplied by the vehicle. The electronic circuitry may be configured to convert the received alternating current into direct current within a predetermined voltage range. The output connectors may be configured to supply the direct current from the electronic circuitry to the vehicle.

In illustrative embodiments, the at least one connector may be stamped from a sheet of electrically conductive material and shaped to form the substantially square cross-section.

In illustrative embodiments, the connector assembly may further include a cover plate coupled to the at least one connector, the cover plate being formed to include the at least one socket.

In illustrative embodiments, the cover plate and the at least one connector may be integral.

In illustrative embodiments, the electrical apparatus may further include a lock member coupled to the connector assembly and associated with the at least one socket, the lock member being rotatable relative to the at least one socket.

In illustrative embodiments, the lock member may include a pair of lock fingers configured to grip the plug positioned within the at least one socket to retain the plug within the at least one socket.

In illustrative embodiments, the lock member may be coupled to the connector assembly by a living hinge.

In illustrative embodiments, the lock member and associated living hinge may be integral with the connector assembly.

In illustrative embodiments, the lock member may further include a pair of pivot arms, the pivot arms configured to pivotally attach the lock member with the connector assembly and allow rotation of the lock member about an axis of rotation.

In illustrative embodiments, the lock member may further include a lock tab, the lock tab configured to engage with a portion of the connector assembly to maintain a rotational position of the lock member relative to the at least one socket.

In illustrative embodiments, the pivot arms may be coupled to the lock fingers and extend in a first direction away from the lock fingers. The lock member may further include a wall coupled to the lock fingers and extends in a second direction away from the lock fingers opposite the first direction.

According to a second aspect of the present disclosure, an electrical connection includes an electrically conductive tube and an electrically conductive sleeve sized to receive the electrically conductive tube. The electrically conductive tube may have a first end and a second end spaced apart from the first end. The electrically conductive tube may be substantially square in cross-section. The electrically conductive sleeve may be substantially circular in cross-section.

The first end of the electrically conductive tube may be configured to be inserted into the electrically conductive sleeve such that corners of the electrically conductive tube engage with the electrically conductive sleeve. The corners of the electrically conductive tube may be rounded to form a contact area between the electrically conductive tube and the electrically conductive sleeve.

In illustrative embodiments, the electrically conductive tube may be formed from a sheet of electrically conductive material having ends that are bent toward one another such that a seam is formed along a length of the electrically conductive tube where the ends of the sheet meet.

In illustrative embodiments, the electrically conductive sleeve may be formed from a sheet of electrically conductive material having ends that are bent toward one another such that a gap is formed along a length of the electrically conductive sleeve.

In illustrative embodiments, the electrically conductive tube may be positioned within a socket of a connector assembly and the electrically conductive sleeve may be positioned within a plug that is sized to be received in the socket of the connector assembly.

According to a second aspect of the present disclosure, an electrical apparatus for use with a vehicle includes a metallic housing, electronic circuitry and a connector assembly. The metallic housing may be formed to include a cavity and a plurality of heat-sink fins configured to dissipate heat from the metallic housing. The electronic circuitry may be positioned within the cavity of the housing. The electronic circuitry may include integrated components coupled to a circuit board. The integrated components may form a combined voltage regulator and voltage rectifier circuit.

The connector assembly may be positioned to cover an opening into the cavity and engage the metallic housing to seal the cavity. The connector assembly may include a first socket, a second socket spaced apart from the first socket, and a bus bar. The bus bar may include three input connectors positioned within the first socket and two output connectors positioned within the second socket. The input connectors and output connectors may be electrically coupled with the electronic circuitry. Each of the input connectors and output connectors may include at least a portion that is substantially square in cross-section and have corners that are rounded.

Additional features of the present disclosure will become apparent to those skilled in the art upon consideration of illustrative embodiments exemplifying the best mode of carrying out the disclosure as presently perceived.

BRIEF DESCRIPTION OF THE DRAWINGS

The detailed description particularly refers to the accompanying figures in which.

DETAILED DESCRIPTION

Figure 1:
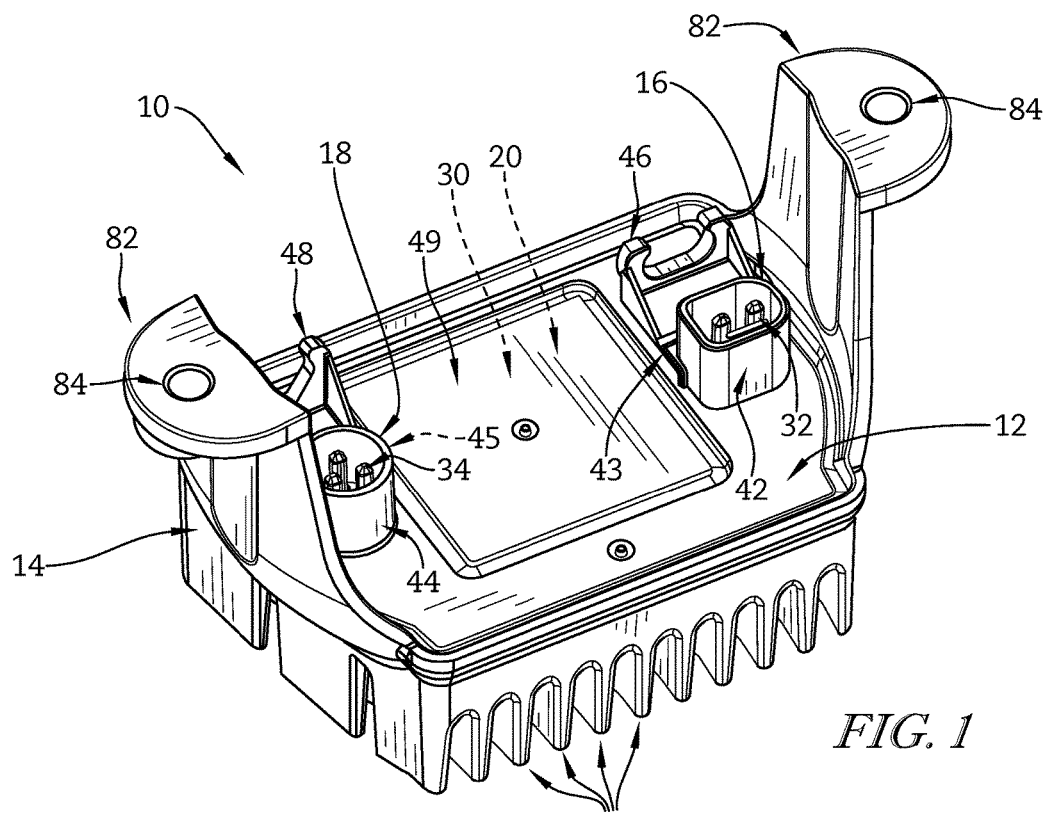
FIG. 1 is a perspective view of a first embodiment of an electrical connection box in accordance with the present disclosure showing that the electrical connection box includes a connector unit coupled to a metallic heat-sink housing.
Figure 2:
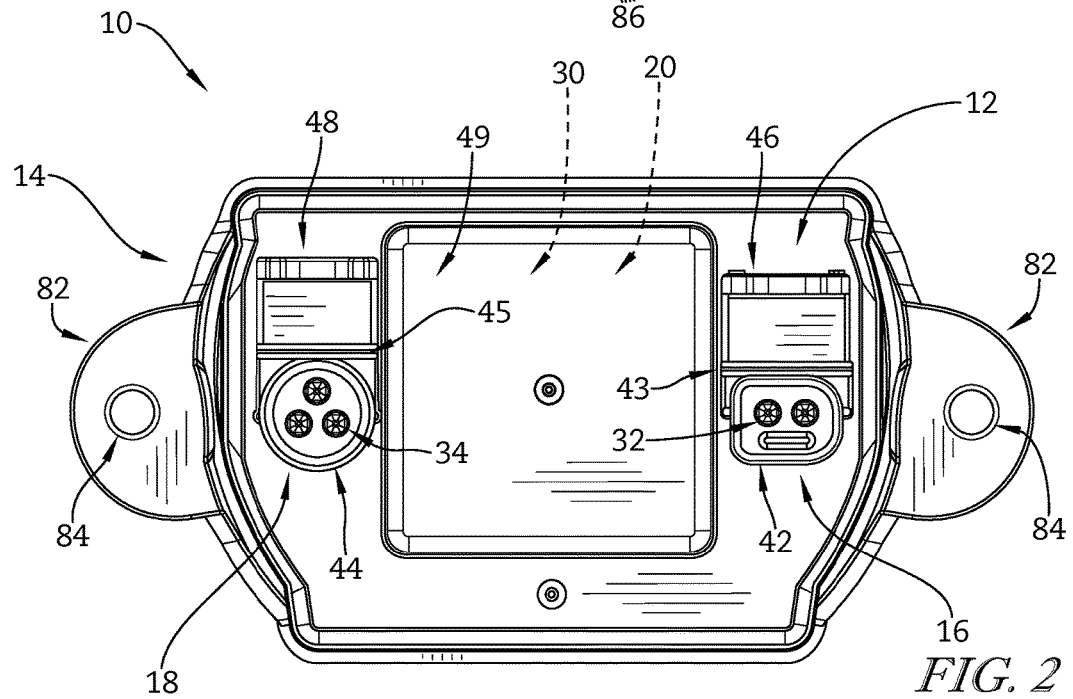
FIG. 2 is a rear view of the connection box of FIG. 1 showing that the connector unit includes a "D" shaped socket and a round shaped socket for receiving corresponding plugs from electrical components of a vehicle.
Figure 3:
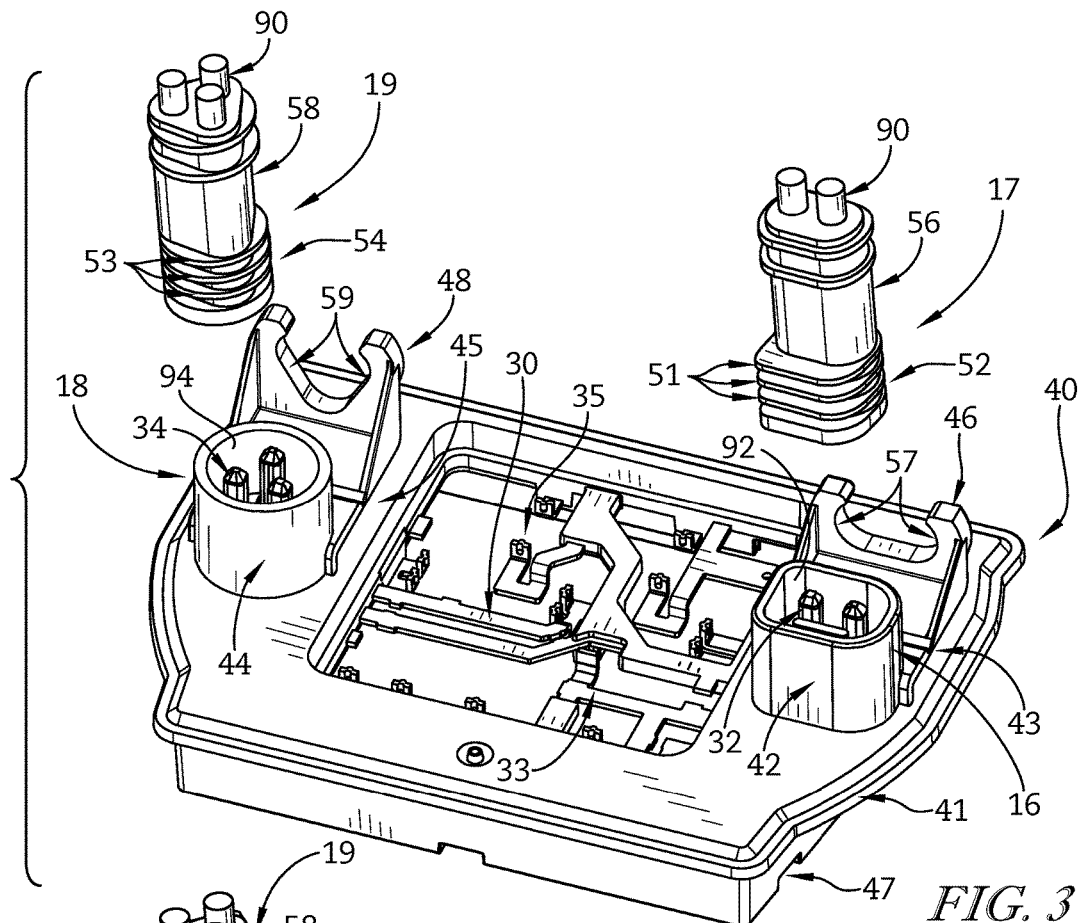
FIG. 3 is an exploded view of a connector plate assembly of the connector unit showing a pair of plugs aligned to be inserted into the round and "D" shaped sockets.
Figure 4:
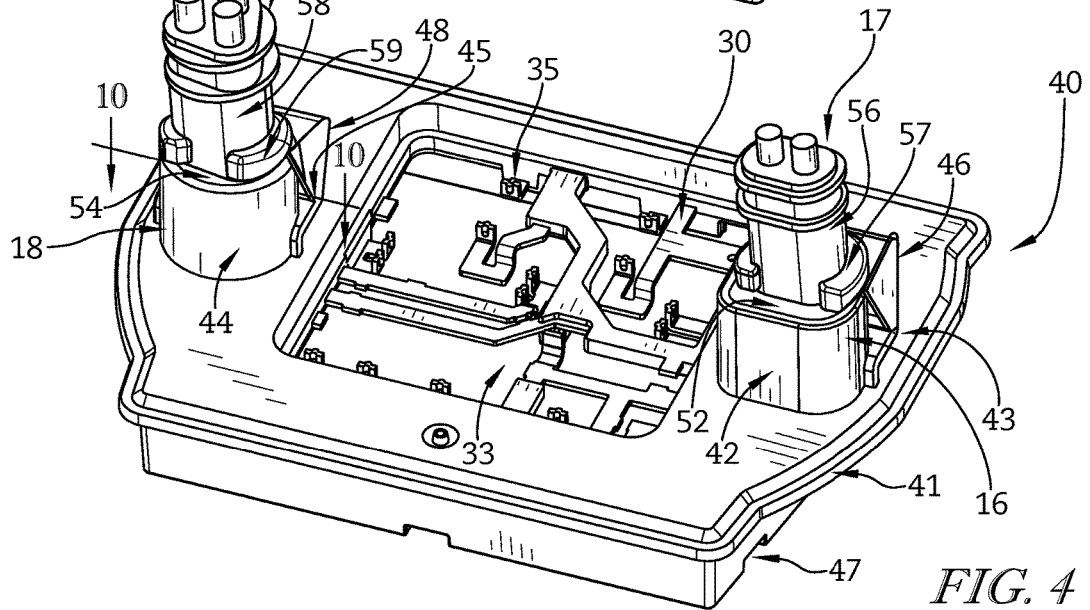
FIG. 4 is a perspective view of the connector plate assembly of FIG. 3 showing the pair of plugs inserted into the sockets and also showing that the connector plate assembly includes a pair of lock members connected to the connector plate assembly by living hinges for rotation to engage the plugs to secure them within the sockets.
Figure 5:
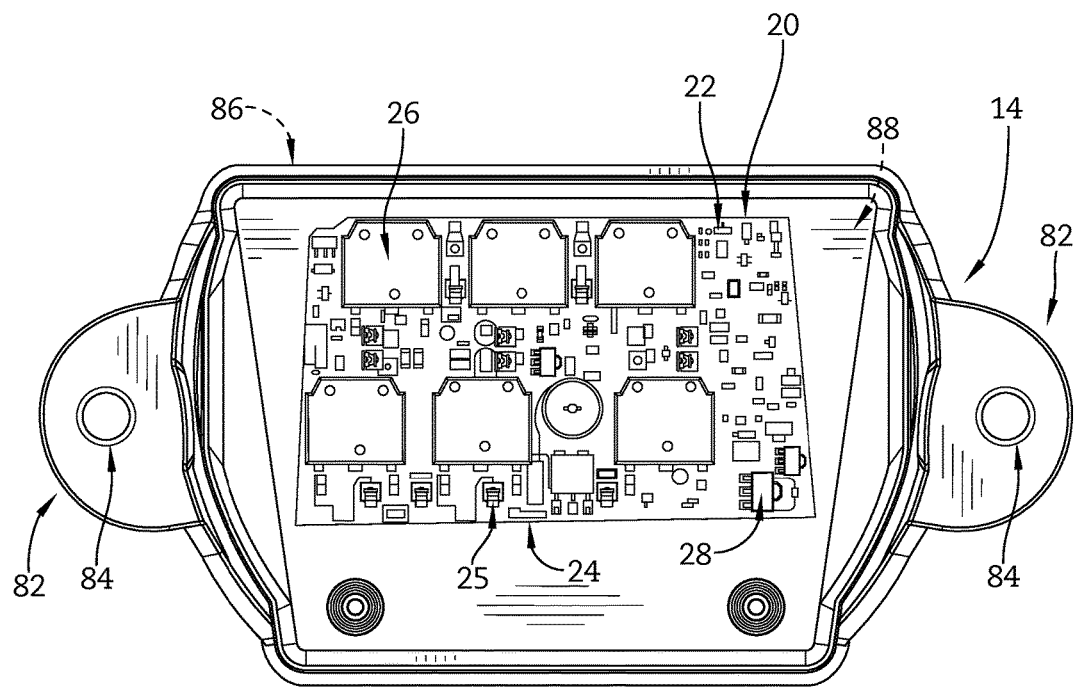
FIG. 5 is a rear view of a combined voltage regulator and voltage rectifier circuit (voltage regulator/rectifier circuit) positioned within the metallic heat-sink housing.
Figure 6:
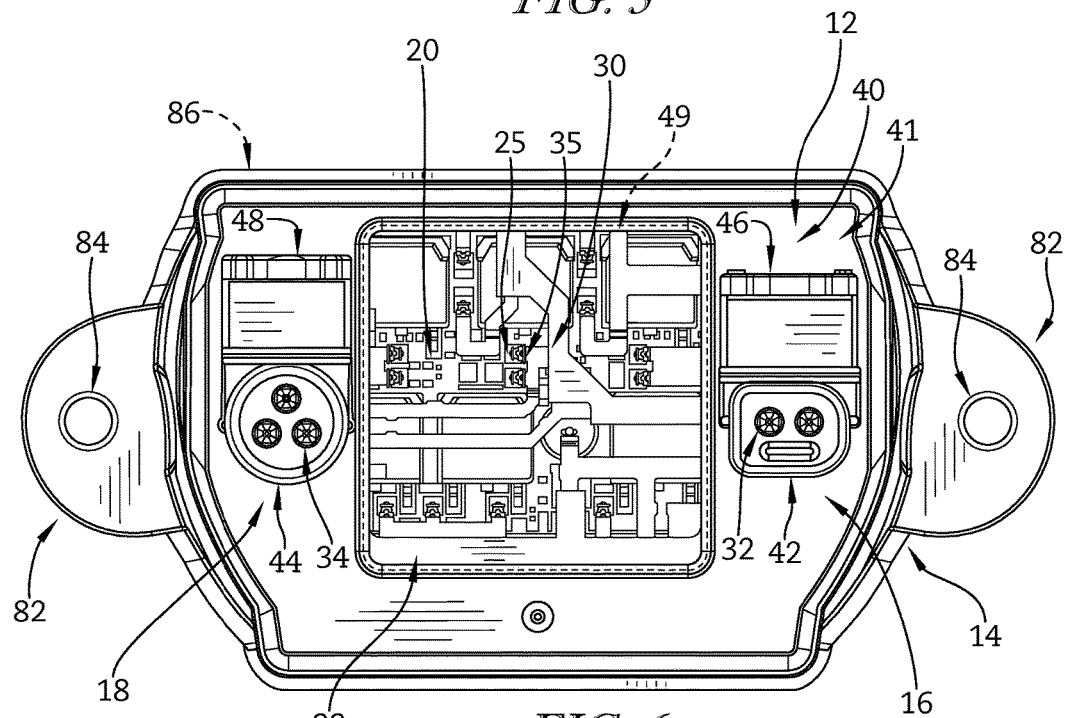
FIG. 6 is a rear view of the connection box with a square access cover removed showing that contact points of the connector plate assembly engage with the voltage regulator/rectifier circuit to electrically connect the sockets with the voltage regulator/rectifier circuit.
Figure 7:
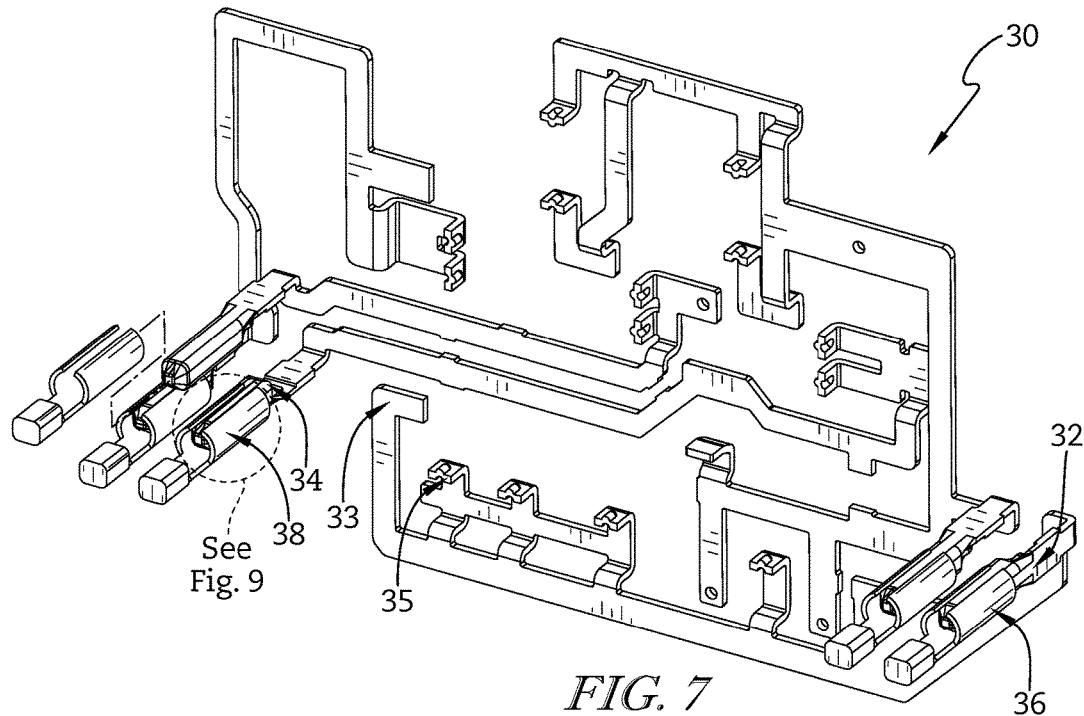
FIG. 7 is a perspective view of a bus bar showing that terminal connectors of the "D" shaped and round shaped sockets are coupled together by electronic links which are formed to include the contact points.
Figure 8:
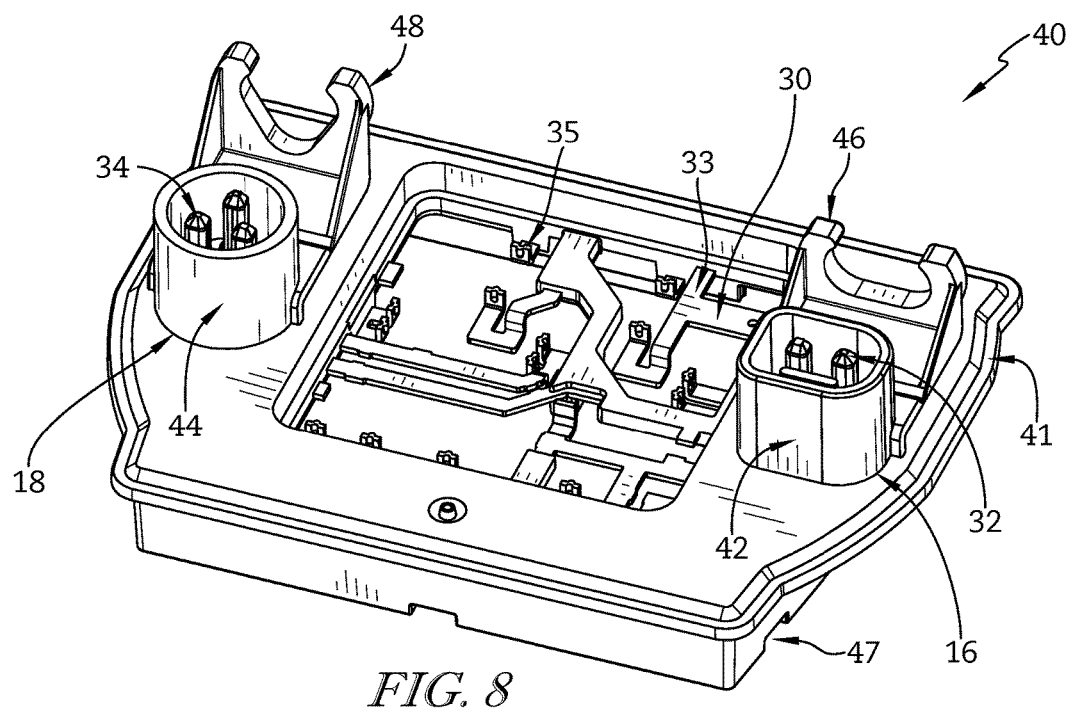
FIG. 8 is a perspective view of the connector plate assembly showing that the bus bar is coupled with a cover plate to form the connector plate assembly.
Figure 9:
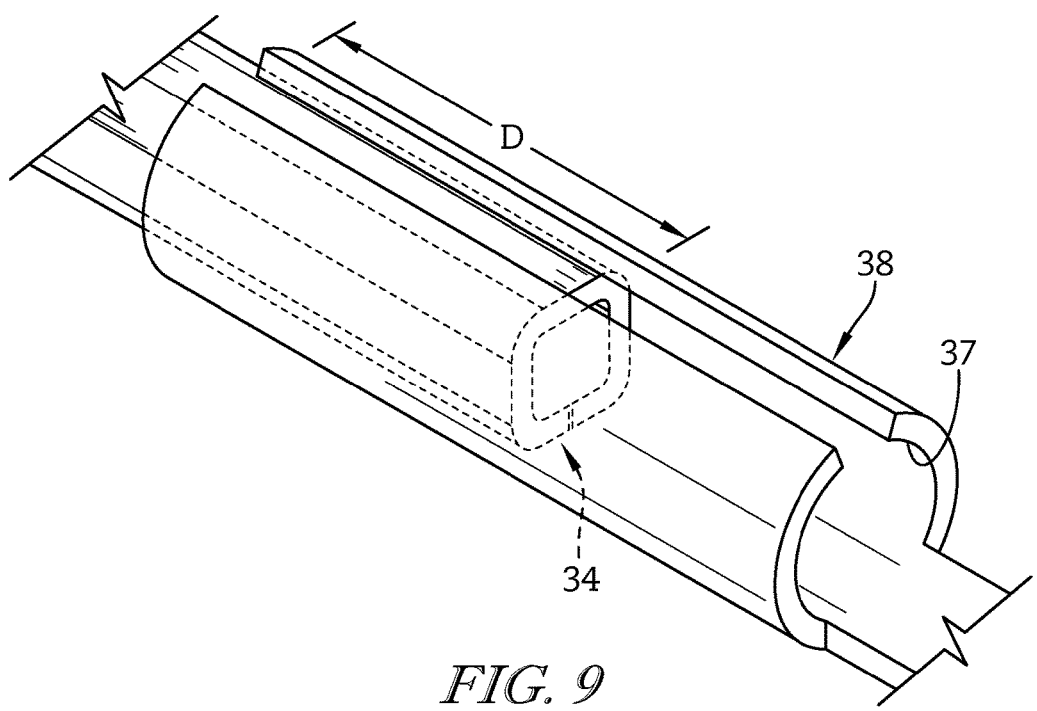
FIG. 9 is a partial perspective view of a square male terminal connector of the sockets inserted into a split cylinder female connector of the plugs.
Figure 10:
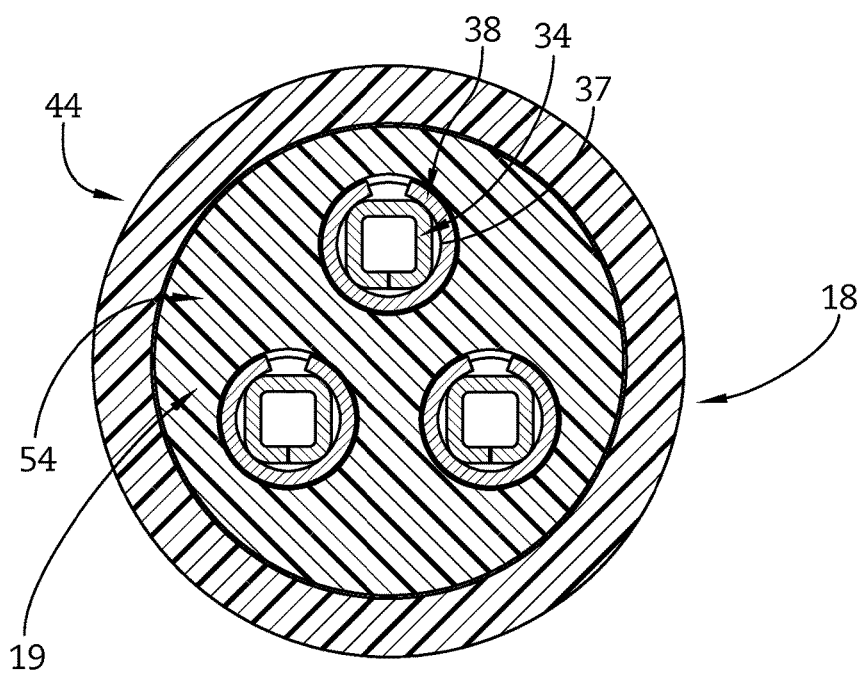
FIG. 10 is a sectional view taken along line 10-10 of FIG. 4 showing three square male terminal connectors coupled with three split cylinder female connectors of the round shaped socket and plug, respectively.

A first embodiment of an electrical connection box 10 in accordance with the present disclosure includes a connector unit 12 coupled to a metallic heat-sink housing 14 as shown in FIGS. 1 and 2. Connector unit 12 includes a pair of sockets 16, 18 for connecting vehicle electronics with electronic circuitry 20 of connector unit 12 by way of plugs 17, 19 as shown in FIGS. 3-5. Sockets 16, 18 are electrically coupled to electronic circuitry 20 by a bus bar 30 as shown in FIGS. 6-8. Male terminal connectors 32, 34 of sockets 16, 18, respectively, are substantially square in cross-section and engage with cylindrical female connectors 36, 38 of plugs 17, 19, respectively, as shown in FIGS. 9 and 10.

In the illustrative embodiment, an electrical connection box 10 includes a connector unit 12 for electrically connecting with components of a motor vehicle and a metallic heat-sink housing 14 for securing connector unit 12 to the motor vehicle as shown in FIG. 1. The motor vehicle may be any type of motorized vehicle, including a motorcycle, automobile, truck, snowmobile, watercraft, or farm implement, for example. Alternatively, electrical connection box 10 may be coupled to any device requiring electrical connection to a circuit board.

Connector unit 12 includes a "D" shaped socket 16 and a round shaped socket 18 as shown in FIG. 1. Sockets 16, 18, however, may assume any shape, including round, square, or asymmetrical, for example. "D" shaped socket 16 includes a plug receiver 42 and a lock member 46 coupled to plug receiver 42 by a living hinge 43. Similarly, round shaped socket 18 includes a plug receiver 44 and a lock member 48 coupled to plug receiver 44 by a living hinge 45.

Connector unit 12 also includes a connector plate assembly 40 and sockets 16, 18 are formed as part of connector plate assembly 40 as shown in FIGS. 3 and 4. A bus bar 30 is coupled to a cover plate 41 to form connector plate assembly 40 as suggested in FIGS. 7 and 8. Cover plate 41 is formed from an electrically insulating material. In some embodiments, cover plate 41 is formed from plastic. The plastic may be glass filled for additional electrical and temperature resistance. However, other materials may be used to form cover plate 41. In some embodiments, plug receivers 42, 44, lock members 46, 48, and living hinges 43, 45 are formed as part of cover plate 41.

In some embodiments, bus bar 30 is positioned within a mold cavity and material is injected into the mold cavity to surround bus bar 30 to form cover plate 41 such that bus bar 30 and cover plate 41 are integral. In other embodiments, bus bar 30 is positioned between cover plate 41 and a back plate 47 which engages with cover plate 41 to form connector plate assembly 40. In some embodiments, bus bar 30 is formed as a unitary structure and portions are removed to form links 33. Links 33 may be formed before or after connecting bus bar 30 with cover plate 41. In other embodiments, links 33 of bus bar 30 are formed individually. Links 33 may then be placed within a mold cavity and material is injected into the mold cavity to surround links 33 to form cover plate 41 such that links 33 and cover plate 41 are integral.

Sockets 16, 18 are arranged to receive plugs 17, 19 attached to components of the motor vehicle by wires 90 (only a portion of which are shown) as suggested in FIGS. 3 and 4. Plugs 17, 19 include female connectors 36, 38, respectively, which engage with male terminal connectors 32, 34 to provide an electrical connection between bus bar 30 and wires 90. Bus bar 30 engages with electronic circuitry 20 positioned within metallic heat-sink housing 14 as shown in FIG. 6. In some embodiments, plugs 17, 19 are part of a wiring harness of the motor vehicle and are molded onto ends of wires 90, which are coupled to cylindrical female connectors 36, 38 embedded within plugs 17, 19, respectively.

In the illustrative embodiment, each of male terminal connectors 32, 34 are substantially square in cross-section, though only male terminal connectors 34 are shown in FIGS. 9 and 10. Female connectors 36, 38 are substantially cylindrical, though only female connectors 38 are shown in FIGS. 9 and 10. In some embodiments, the cylinders of female connectors 36, 38 are split along their length. The corners of male terminal connectors 32, 34 are rounded and sized to engage with inner surfaces 37 of female connectors 36, 38. Male terminal connectors 32, 34 also extend into cylindrical female connectors 36, 38 to a distance D.

The radius of the rounded corners of male terminal connectors 32, 34 and insertion distance D determine the amount of contact area between male terminal connectors 32, 34 and female connectors 36, 38. Increasing the contact area assists in lowering an electrical resistivity between the connectors, which lowers an amount of voltage loss across the electrical connection. In the illustrative embodiment, male terminal connectors 32, 34 are preferably square in cross-section and provide four areas of contact with cylindrical female connectors 36, 38.

In the illustrative embodiment, ends of links 33 of bus bar 30 are bent upward and shaped to form male terminal connectors 32, 34 as suggested in FIG. 7. In some embodiments, bus bar 30 is stamped from a sheet of material and formed to include contact points 35 and male terminal connectors 32, 34. For example, bus bar 30 may be formed in a progressive die machine including a plurality of stations, each station partially working the material until the bus bar 30 is formed. In some embodiments, bus bar 30 is stamped and formed from brass that is pre-plated with tin. However, other electrically conductive materials may be used, such as copper or aluminum, for example. Bus bar 30 may then be coupled with cover plate 41 to form connector plate assembly 40. Similarly, female connectors 36, 38 may be stamped from a sheet of material, shaped into the desired form, and coupled to wires 90. Female connectors 36, 38 may then be integrated into plugs 17, 19 through an injection molding process, for example.

Two male terminal connectors 32 are positioned in plug receiver 42 of "D" shaped socket 16 as shown in FIG. 6. Plug receiver 42 is substantially asymmetrical across at least one axis of asymmetry. Male terminal connectors 32 are aligned with plug receiver 42 such that male terminal connectors 32 are positioned on opposing sides of an axis of asymmetry of plug receiver 42. Three male terminal connectors 34 are positioned in plug receiver 44 of round shaped socket 18. Male terminal connectors 34 are arranged in a triangular pattern. The triangular pattern may be in the form of a substantially equilateral triangle. However, other arrangements for male terminal connectors 32, 34 are possible.

Plug 17 includes a shaft 56 and a plug end 52 coupled to shaft 56 and corresponding in shape with plug receiver 42 as shown in FIGS. 3 and 4. The corresponding shapes of plug receiver 42 and plug end 52 aligns plug 17 with socket 16. Shaft 56 is substantially oblong in shape, but other shapes are possible. Plug 19 includes a shaft 58 and a plug end 54 coupled to shaft 58 and corresponding in shape with plug receiver 44. The corresponding shapes of plug receiver 44 and plug end 54 aligns plug 19 with socket 18. Shaft 58 is substantially triangular in shape, but other shapes are possible.

Plug 17 is formed to include one or more seal rings 51 at plug end 52 as shown in FIG. 3. Similarly, plug 19 is formed to include one or more seal rings 53 at plug end 54. Seal rings 51, 53 are sized and shaped to engage with walls 92, 94 of plug receivers 42, 44, respectively, to form seals with plug receivers 42, 44. This creates a waterproof connection between plugs 17, 19 and sockets 16, 18.

After plugs 17, 19 have been inserted into sockets 16, 18, respectively, lock members 46, 48 can be rotated upwards to engage with shafts 56, 58 as suggested in FIGS. 3 and 4. Lock members 46, 48 prevent unintentional disconnection of plugs 17, 19 from sockets 16, 18 due to vibration. Lock member 46 is formed to include lock fingers 57 which substantially match an outer profile of shaft 56 of plug 17. Similarly, lock member 48 is formed to include lock fingers 59 which substantially match an outer profile of shaft 58 of plug 19. Lock members 46, 48 engage with plugs 17, 19 to maintain engagement of cylindrical female connectors 36, 38 with male terminal connectors 32, 34.

Electronic circuitry 20 is positioned within a cavity 88 formed in metallic heat-sink housing 14 as shown in FIG. 5. Electronic circuitry 20 includes a plurality of integrated components 22 coupled to a circuit board 24. In the illustrative embodiment, integrated components 22 include one or more diodes 26 and one or more transistors 28 coupled to circuit board 24 to form a combined voltage regulator and voltage rectifier circuit (voltage regulator/rectifier circuit). Contact receivers 25 are also coupled to circuit board 24 and positioned to engage with contact points 35 formed on bus bar 30 as shown in FIG. 6. Connector plate assembly 40 engages with a rim of cavity 88 to seal cavity 88. An access panel 49 (shown in phantom in FIG. 6) engages and seals with connector plate assembly 40 to cover electronic circuitry 20. The seals provide a waterproof chamber to prevent damage to electronic circuitry 20.

In one illustrative embodiment, electronic circuitry 20 includes the voltage regulator/rectifier circuit, which operates to convert alternating current (AC) being produced by an alternator of the motor vehicle into direct current (DC) for charging a battery of the vehicle and operating electrical components, such as lights. The voltage regulator/rectifier circuit also operates to limit the voltage sent to the battery, such as between about 14 volts and about 15 volts. In some embodiments, plug 19 is connected to the alternator of the motor vehicle and three female connectors 38 form the active, neutral, and ground connections with three male terminal connectors 34. The AC supplied by the alternator passes through plug 19 and socket 18 into bus bar 30 and electronic circuitry 20. Electronic circuitry 20 converts the AC to DC at the appropriate voltage and supplies it to male terminal connectors 32 of socket 16. Female connectors 36 of plug 17 connect with male terminal connectors 32 of socket 16 to send the DC to the battery and other electronic components of the vehicle.

In the illustrative embodiment, metallic heat-sink housing 14 is formed to include arms 82 for coupling electrical connection box 10 to the motor vehicle and fins 86 for dissipating heat produced by electronic circuitry 20 as shown in FIG. 1. Arms 82 are formed to include apertures 84. In some embodiments, apertures 84 are threaded to receive a fastener to permit coupling of electrical connection box 10 to the motor vehicle. In other embodiments, apertures 84 are smooth to allow a fastener to pass through apertures 84 to permit coupling of electrical connection box 10 to the motor vehicle.

Figure 11:
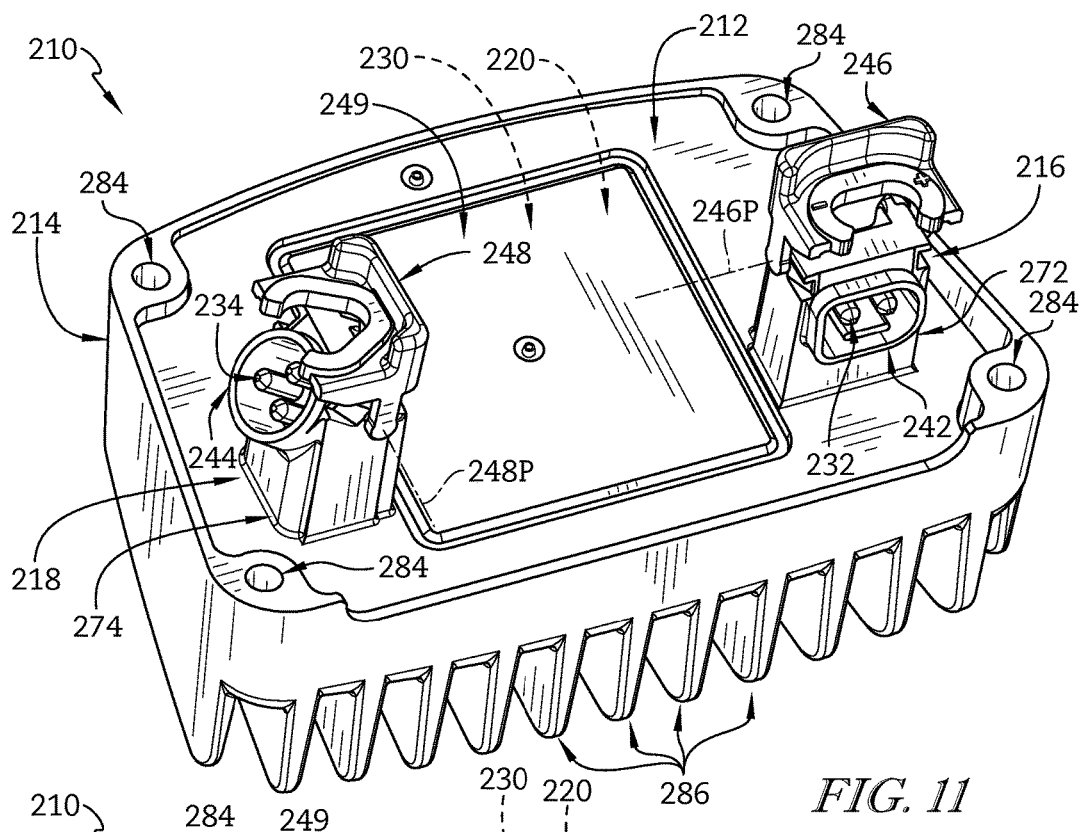
FIG. 11 is a perspective view of a second embodiment of an electrical connection box in accordance with the present disclosure showing that the electrical connection box includes a connector unit coupled to a metallic heat-sink housing.
Figure 12:
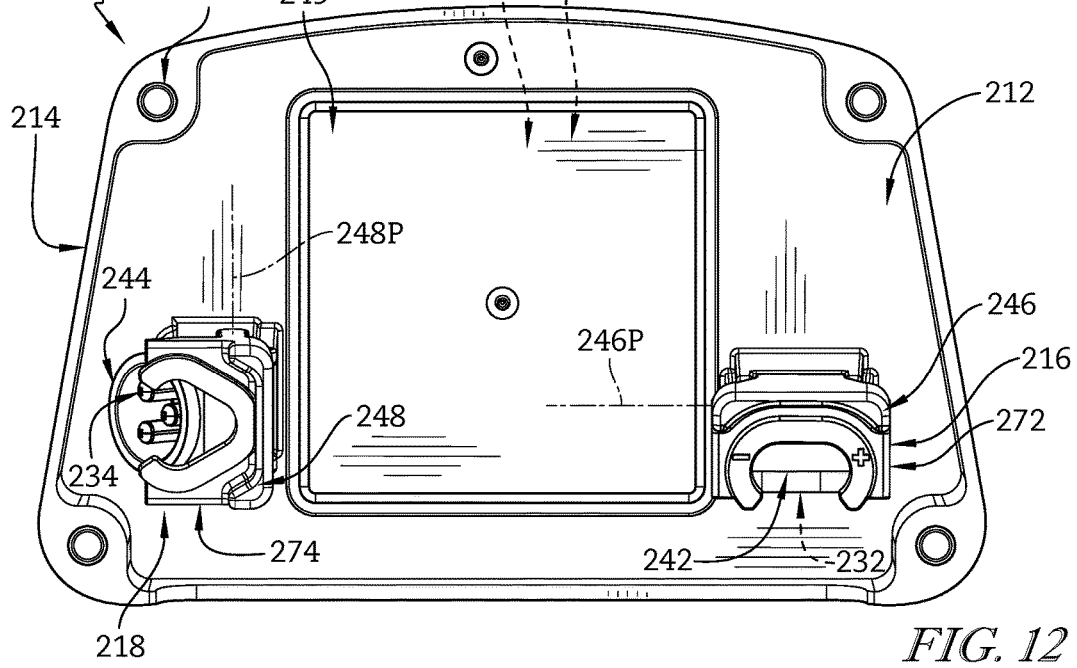
FIG. 12 is a rear view of the connection box of FIG. 11 showing that the connector unit includes a "D" shaped socket and a round shaped socket for receiving corresponding plugs from electrical components of a vehicle.
Figure 13:
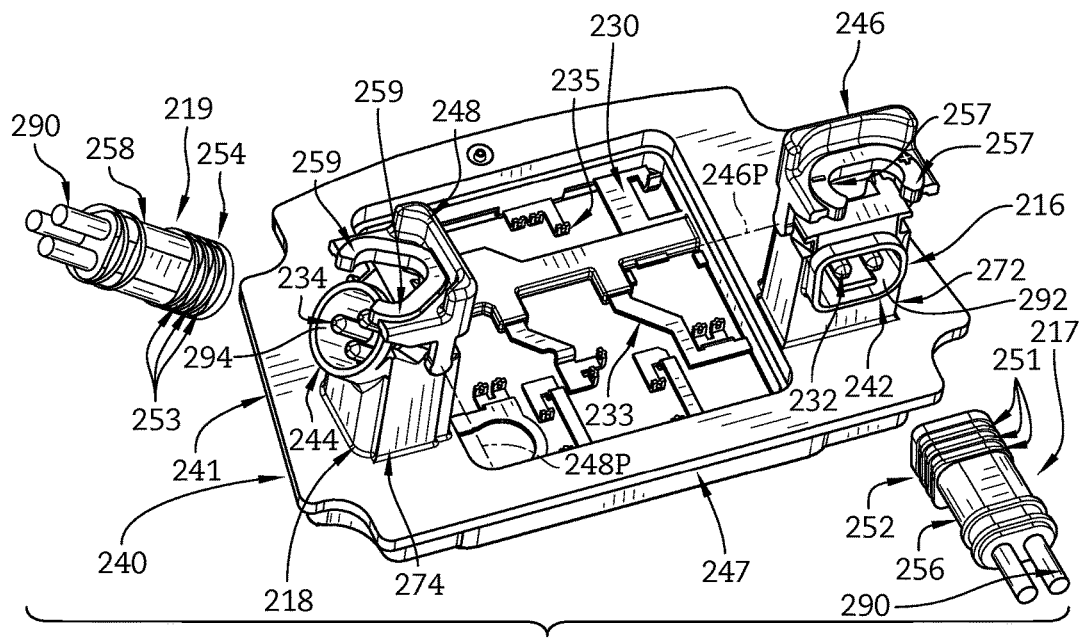
FIG. 13 is an exploded view of a connector plate assembly of the connector unit showing a pair of plugs aligned to be inserted into the round and "D" shaped sockets.
Figure 14:
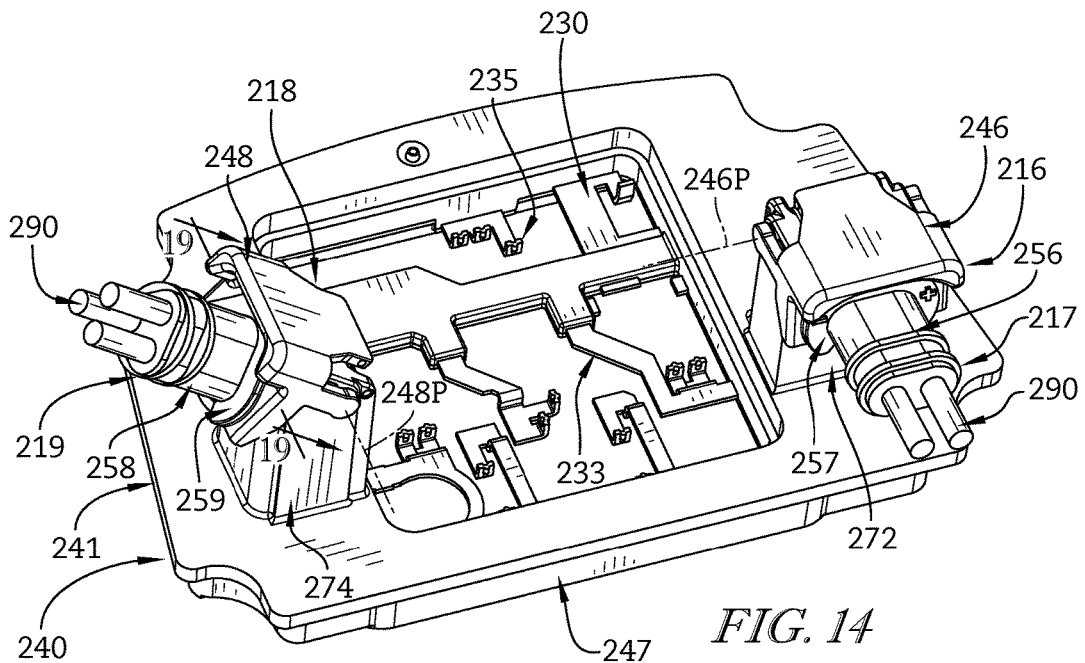
FIG. 14 is a perspective view of the connector plate assembly of FIG. 13 showing the pair of plugs inserted into the sockets and also showing that the connector plate assembly includes a pair of lock members connected to the connector plate assembly for rotation to engage the plugs to secure them within the sockets.
Figure 15:
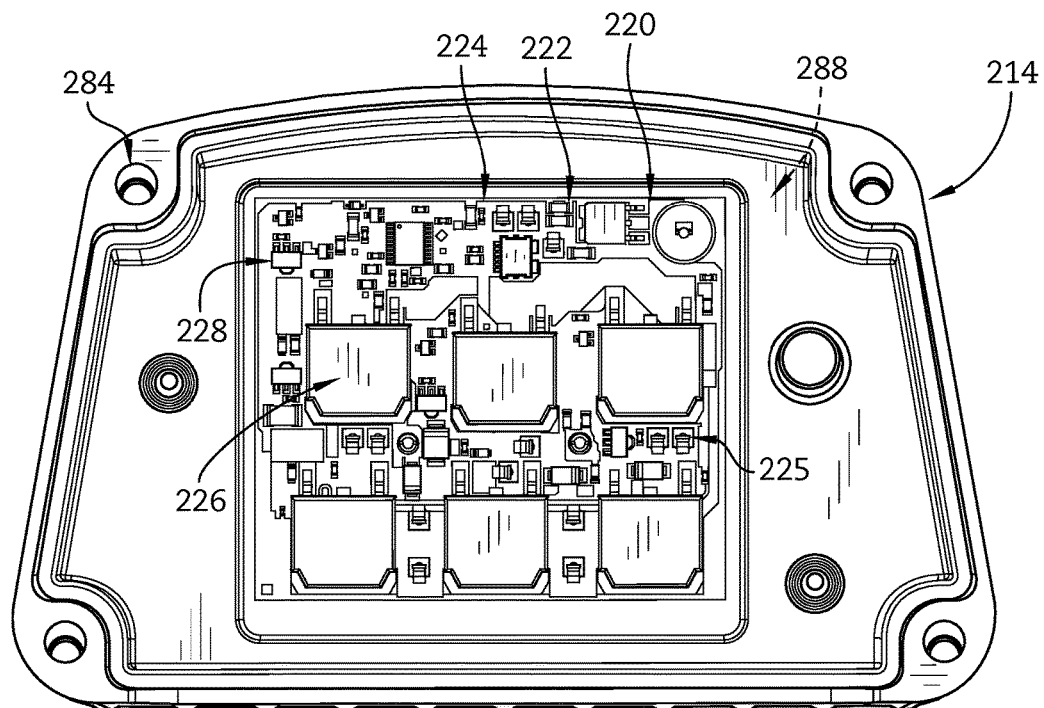
FIG. 15 is a rear view of a combined voltage regulator and voltage rectifier circuit (voltage regulator/rectifier circuit) positioned within the metallic heat-sink housing.
Figure 16:
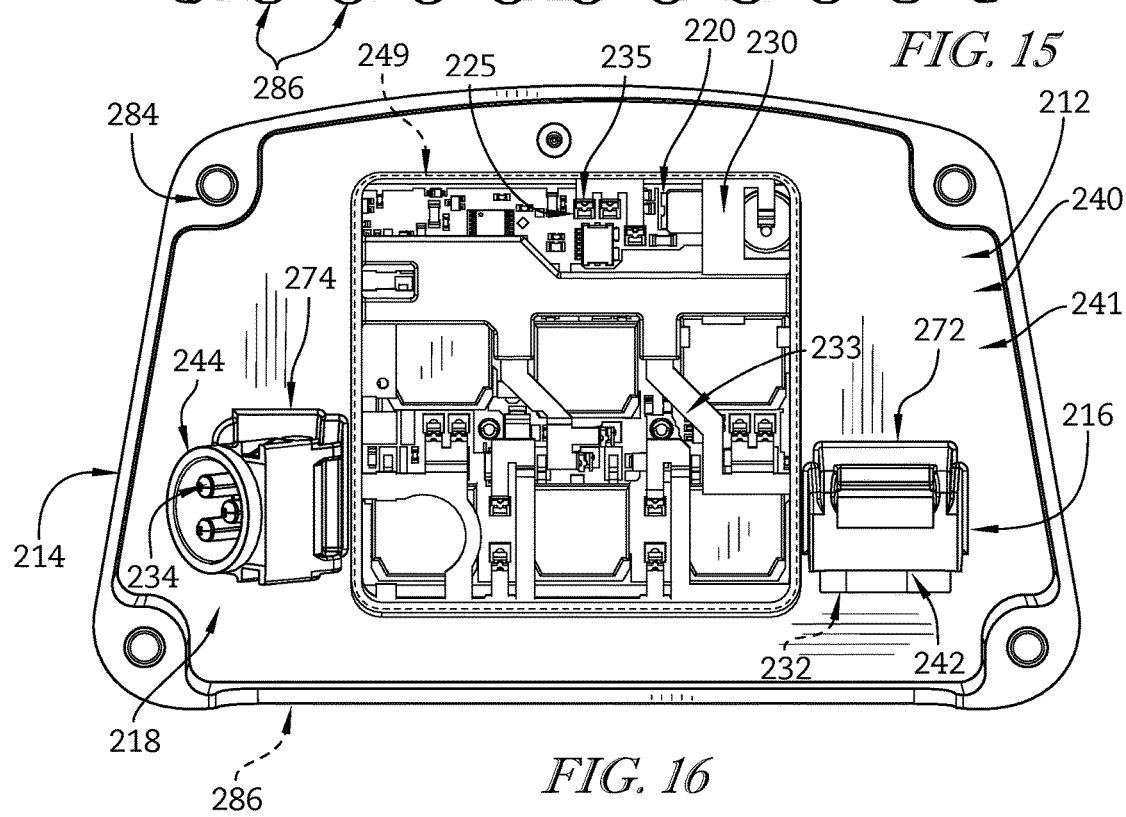
FIG. 16 is a rear view of the connection box with a square access cover removed showing that contact points of the connector plate assembly engage with the voltage regulator/rectifier circuit to electrically connect the sockets with the voltage regulator/rectifier circuit.
Figure 17:
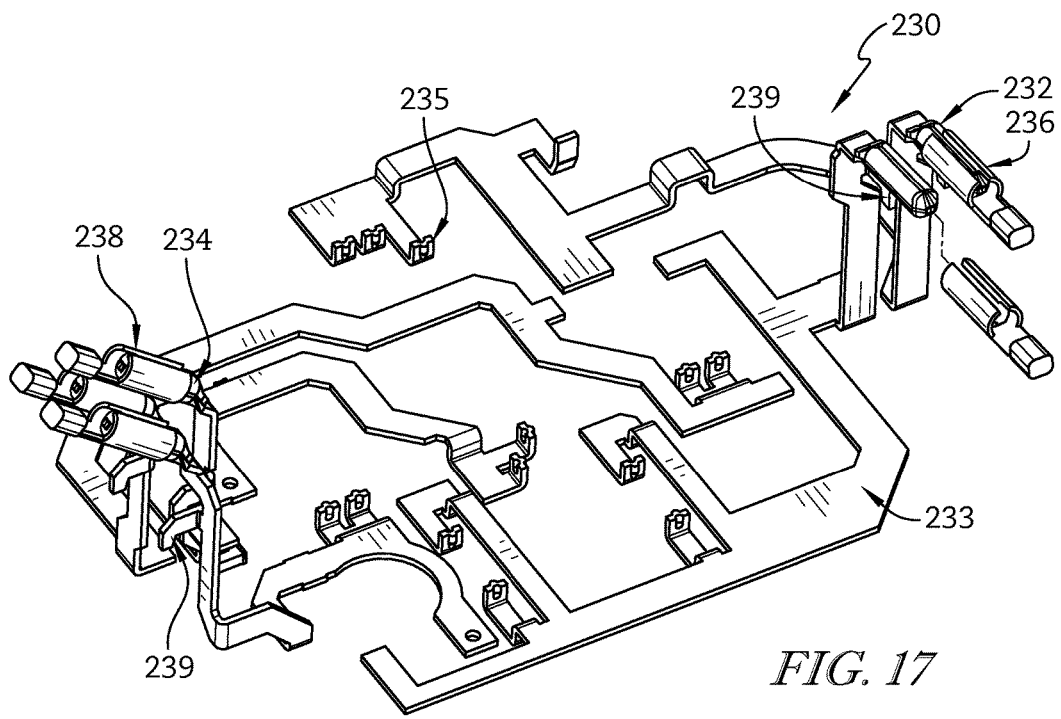
FIG. 17 is a perspective view of a bus bar showing that terminal connectors of the "D" shaped and round shaped sockets are coupled together by electronic links which are formed to include the contact points.
Figure 18:
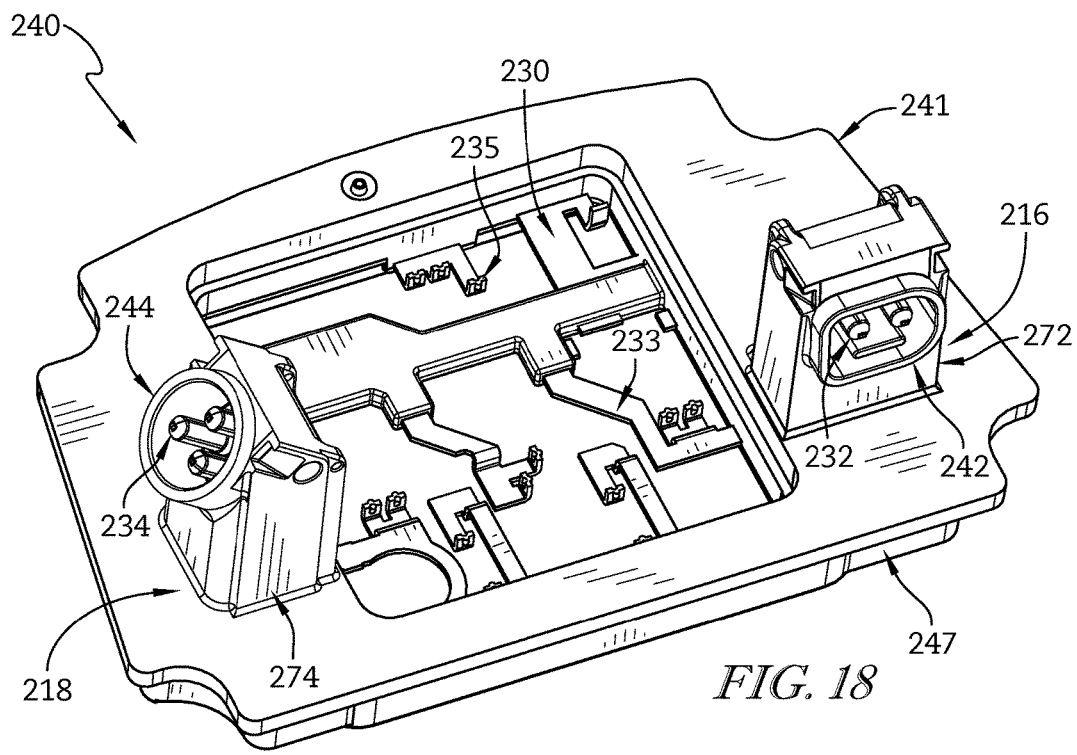
FIG. 18 is a perspective view of the connector plate assembly showing that the bus bar is coupled with a cover plate to form the connector plate assembly.
Figure 19:
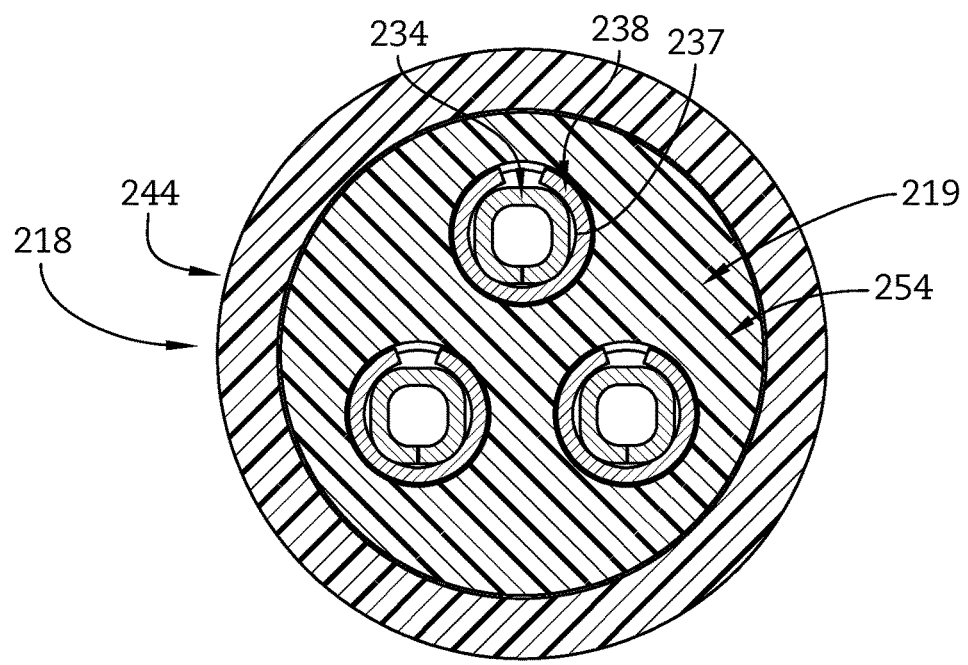
FIG. 19 is a sectional view taken along line 19-19 of FIG. 14 showing three square male terminal connectors coupled with three split cylinder female connectors of the round shaped socket and plug, respectively.
Figure 20:
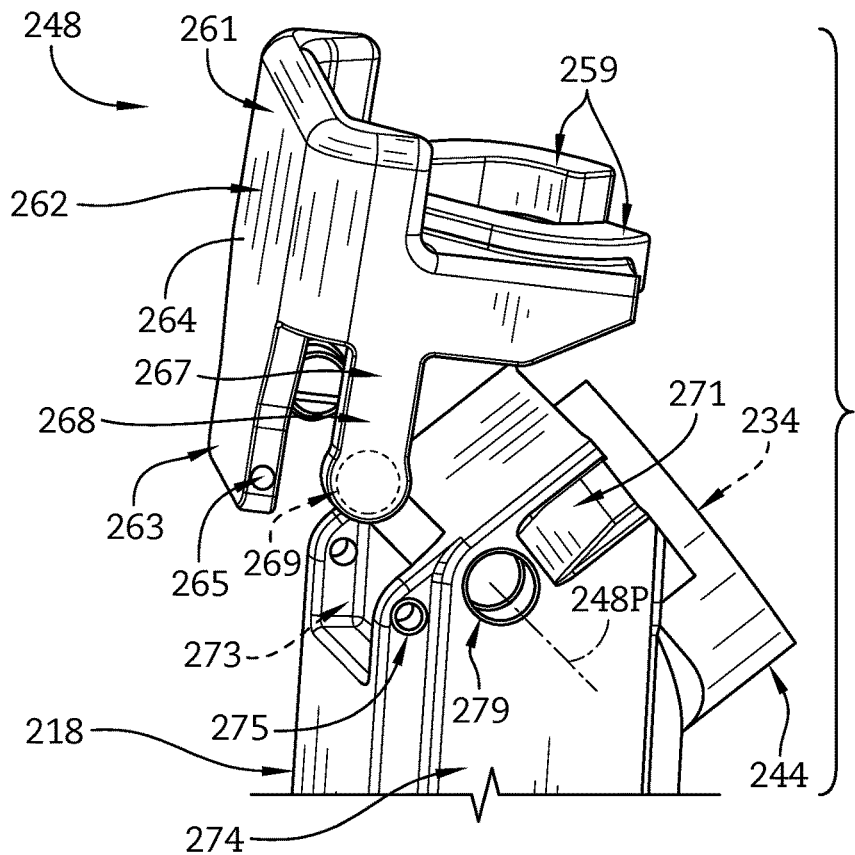
FIG. 20 is a perspective view of the round shaped socket showing that the lock member includes pivot pins which engage with pivot pin receivers formed in the socket to couple the lock member to the socket and allow rotation relative to the socket.

A second embodiment of an electrical connection box 210 in accordance with the present disclosure includes a connector unit 212 coupled to a metallic heat-sink housing 214 as shown in FIGS. 11 and 12. Connector unit 212 includes a pair of sockets 216, 218 for connecting vehicle electronics with electronic circuitry 220 of connector unit 212 by way of plugs 217, 219 as shown in FIGS. 13-15. Sockets 216, 218 are electrically coupled to electronic circuitry 220 by a bus bar 230 as shown in FIGS. 16-18. Male terminal connectors 232, 234 of sockets 216, 218, respectively, are substantially square in cross-section and engage with cylindrical female connectors 236, 238 of plugs 217, 219, respectively, as shown in FIGS. 19 and 20.

In the illustrative embodiment, an electrical connection box 210 includes a connector unit 212 for electrically connecting with components of a motor vehicle and a metallic heat-sink housing 214 for securing connector unit 212 to the motor vehicle as shown in FIG. 11. The motor vehicle may be any type of motorized vehicle, including a motorcycle, automobile, truck, snowmobile, watercraft, or farm implement, for example. Alternatively, electrical connection box 210 may be coupled to any device requiring electrical connection to a circuit board.

Connector unit 212 includes a "D" shaped socket 216 and a round shaped socket 218 as shown in FIG. 11. Sockets 216, 218, however, may assume any shape, including round, square, or asymmetrical, for example. "D" shaped socket 216 includes a tower 272 extending from an upper surface of connector unit 212 and a lock member 246 coupled to tower 272. Tower 272 is formed to include a plug receiver 242. Similarly, round shaped socket 218 includes a tower 274 extending from the upper surface of connector unit 212 and a lock member 248 coupled to tower 274. Tower 274 is formed to include a plug receiver 244.

Connector unit 212 also includes a connector plate assembly 240 and sockets 216, 218 are formed as part of connector plate assembly 240 as shown in FIGS. 13 and 14. A bus bar 230 is coupled to a cover plate 241 to form connector plate assembly 240 as suggested in FIGS. 17 and 18. Cover plate 241 is formed from an electrically insulating material. In some embodiments, cover plate 241 is formed from plastic. The plastic may be glass filled for additional electrical and temperature resistance. However, other materials may be used to form cover plate 241.

Bus bar 230 is also formed to include hooks 239 for engaging with cover plate 241 as shown in FIG. 17. In some embodiments, bus bar 230 is positioned within a mold cavity and material is injected into the mold cavity to surround bus bar 230 to form cover plate 241 such that bus bar 230 and cover plate 241 are integral. In other embodiments, bus bar 230 is positioned between cover plate 241 and a back plate 247 which engages with cover plate 241 to form connector plate assembly 240. In some embodiments, bus bar 230 is formed as a unitary structure and portions are removed to form links 233. Links 233 may be formed before or after connecting bus bar 230 with cover plate 241. In other embodiments, links 233 of bus bar 230 are formed individually. Links 233 may then be placed within a mold cavity and material is injected into the mold cavity to surround links 233 to form cover plate 241 such that links 233 and cover plate 241 are integral.

Sockets 216, 218 are arranged to receive plugs 217, 219 attached to components of the motor vehicle by wires 290 (only a portion of which are shown) as suggested in FIGS. 13 and 14. Plugs 217, 219 include female connectors 236, 238, respectively, which engage with male terminal connectors 232, 234 to provide an electrical connection between bus bar 230 and wires 290. Bus bar 230 engages with electronic circuitry 220 positioned within metallic heat-sink housing 214 as shown in FIG. 16. In some embodiments, plugs 217, 219 are part of a wiring harness of the motor vehicle and are molded onto ends of wires 290, which are coupled to cylindrical female connectors 236, 238 embedded within plugs 217, 219, respectively.

In the illustrative embodiment, each of male terminal connectors 232, 234 are substantially square in cross-section, though only male terminal connectors 234 are shown in FIG. 19. Female connectors 236, 238 are substantially cylindrical, though only female connectors 238 are shown in FIG. 19. In some embodiments, the cylinders of female connectors 236, 238 are split along their length. The corners of male terminal connectors 232, 234 are rounded and sized to engage with inner surfaces 237 of female connectors 236, 238 as male terminal connectors 232, 234 extend into cylindrical female connectors 236, 238.

The radius of the rounded corners of male terminal connectors 232, 234 and insertion distance determine the amount of contact area between male terminal connectors 232, 234 and female connectors 236, 238. Increasing the contact area assists in lowering an electrical resistivity between the connectors, which lowers an amount of voltage loss across the electrical connection. In the illustrative embodiment, male terminal connectors 232, 234 are preferably square in cross-section and provide four areas of contact with cylindrical female connectors 236, 238.

In the illustrative embodiment, ends of links 233 of bus bar 230 are bent upward and shaped to form male terminal connectors 232, 234 as suggested in FIG. 17. In some embodiments, bus bar 230 is stamped from a sheet of material and formed to include contact points 235 and male terminal connectors 232, 234. For example, bus bar 30 may be formed in a progressive die machine including a plurality of stations, each station partially working the material until the bus bar 230 is formed. In some embodiments, bus bar 230 is stamped and formed from brass that is pre-plated with tin. However, other electrically conductive materials may be used, such as copper or aluminum, for example. Bus bar 230 may then be coupled with cover plate 241 to form connector plate assembly 240. Similarly, female connectors 236, 238 may be stamped from a sheet of material, shaped into the desired form, and coupled to wires 290. Female connectors 236, 238 may then be integrated into plugs 217, 219 through an injection molding process, for example.

Two male terminal connectors 232 are positioned in plug receiver 242 of "D" shaped socket 216 as shown in FIG. 16. Plug receiver 242 is substantially asymmetrical across at least one axis of asymmetry. Male terminal connectors 232 are aligned with plug receiver 242 such that male terminal connectors 232 are positioned on opposing sides of an axis of asymmetry of plug receiver 242. Three male terminal connectors 234 are positioned in plug receiver 244 of round shaped socket 218. Male terminal connectors 234 are arranged in a triangular pattern. The triangular pattern may be in the form of a substantially equilateral triangle. However, other arrangements for male terminal connectors 232, 234 are possible.

Plug 217 includes a shaft 256 and a plug end 252 coupled to shaft 256 and corresponding in shape with plug receiver 242 as shown in FIGS. 13 and 14. The corresponding shapes of plug receiver 242 and plug end 252 aligns plug 217 with socket 216. Shaft 256 is substantially oblong in shape, but other shapes are possible. Plug 219 includes a shaft 258 and a plug end 254 coupled to shaft 258 and corresponding in shape with plug receiver 244. The corresponding shapes of plug receiver 244 and plug end 254 aligns plug 219 with socket 218. Shaft 258 is substantially triangular in shape, but other shapes are possible.

Plug 217 is formed to include one or more seal rings 251 at plug end 252 as shown in FIG. 13. Similarly, plug 219 is formed to include one or more seal rings 253 at plug end 254. Seal rings 251, 253 are sized and shaped to engage with plug receivers 242, 244, respectively, to form seals with walls 292, 294 of plug receivers 242, 244. This creates a waterproof connection between plugs 217, 219 and sockets 216, 218.

Lock member 248 includes a push panel 262, a pair of lock fingers 259 extending from push panel 262, and a pair of pivot arms 268 extending from lock fingers 259 as shown in FIG. 20. Push panel 262 provides a surface 264 for a user to apply force to lock member 248 to rotate lock member 248 about pivot axis 248P. Push panel 262 includes a push-panel extension 261 and a lock tab 263 coupled to push-panel extension 261 to form surface 264. Lock tab 263 is formed to include detents 265 on opposing sides of lock tab 263. Pivot arms 268 each include an arm bar 267 extending from one of lock fingers 259 and a pivot pin 269 coupled at and end of arm bar 267. Lock member 246 and lock member 248 are similar in construction. However, in the illustrative embodiment, lock member 246 includes lock fingers 257 which are a different size and shape than lock fingers 259 as shown in FIGS. 11 and 12.

Tower 274 is formed to include pin ramps 271, pivot-pin receivers 279, a recess 273, and detent receivers 275 as shown in FIG. 20. Pivot pins 269 are sized to be received in pivot-pin receivers 279 and allow rotation of lock member 248 about pivot axis 248P. Pin ramps 271 guide pivot pins 269 of lock member 248 toward pivot-pin receivers 279 as lock member 248 is being attached to tower 274. Pin ramps 271 also force pivot pins 269 outward to allow pivot pins 269 to pass into pivot-pin receivers 279. Recess 273 is sized to receive lock tab 263 to allow detents 265 to engage with detent receivers 275. Detents 265 and detent receivers 275 cooperate to maintain lock member 248 in an unlocked position, as shown in FIG. 13, until a user rotates lock member 248 toward a locked position, as shown in FIG. 14. Tower 272 and tower 274 are similar in construction. However, in the illustrative embodiment, plug receiver 242 and plug receiver 244 are positioned at different angles relative to the upper surface of connector unit 212 as shown in FIGS. 11 and 12.

After plugs 217, 219 have been inserted into sockets 216, 218, respectively, lock members 246, 248 can be rotated about pivot axes 246P, 248P, respectively, to engage with shafts 256, 258 of plugs 217, 219 as suggested in FIGS. 13 and 14. Lock members 246, 248 prevent unintentional disconnection of plugs 217, 219 from sockets 216, 218 due to vibration. Lock fingers 257 of lock member 246 substantially match an outer profile of shaft 256 of plug 217. Similarly, lock fingers 259 of lock member 248 substantially match an outer profile of shaft 258 of plug 219. Lock members 246, 248 engage with plugs 217, 219 to maintain engagement of cylindrical female connectors 236, 238 with male terminal connectors 232, 234.

Electronic circuitry 220 is positioned within a cavity 288 formed in metallic heat-sink housing 214 as shown in FIG. 15. Electronic circuitry 220 includes a plurality of integrated components 222 coupled to a circuit board 224. In the illustrative embodiment, integrated components 222 include one or more diodes 226 and one or more transistors 228 coupled to circuit board 224 to form a combined voltage regulator and voltage rectifier circuit (voltage regulator/rectifier circuit). Contact receivers 225 are also coupled to circuit board 224 and positioned to engage with contact points 235 formed on bus bar 230 as shown in FIG. 16. Connector plate assembly 240 engages with a rim of cavity 288 to seal cavity 288. An access panel 249 (shown in phantom in FIG. 16) engages and seals with connector plate assembly 240 to cover electronic circuitry 220. The seals provide a waterproof chamber to prevent damage to electronic circuitry 220.

In some embodiments, plug 219 is connected to the alternator of the motor vehicle and three female connectors 238 form the active, neutral, and ground connections with three male terminal connectors 234. The AC supplied by the alternator passes through plug 219 and socket 218 into bus bar 230 and electronic circuitry 220. Electronic circuitry 220 converts the AC to DC at the appropriate voltage and supplies it to male terminal connectors 232 of socket 216. Female connectors 236 of plug 217 connect with male terminal connectors 232 of socket 216 to send the DC to the battery and other electronic components of the vehicle.

Metallic heat-sink housing 214 is formed to include apertures 284 for coupling electrical connection box 210 to the motor vehicle and fins 286 for dissipating heat produced by electronic circuitry 220 as shown in FIG. 11. In some embodiments, apertures 284 are threaded to receive a fastener to permit coupling of electrical connection box 210 to the motor vehicle. In other embodiments, apertures 284 are smooth to allow a fastener to pass through apertures 284 to permit coupling of electrical connection box 210 to the motor vehicle.

In the illustrative embodiment, plug receiver 244 and male terminal connectors 234 are positioned at substantially 45 degrees relative to the upper surface of the connector unit 212 as shown in FIG. 11. Plug receiver 242 and male terminal connectors 232 are positioned substantially parallel to the upper surface of the connector unit 212. Plug receiver 244 is positioned at substantially 90 degrees relative to plug receiver 242. However, other orientations of the plug receivers 242, 244 and male terminal connectors 232, 234 are possible.

Various features of the invention have been particularly shown and described in connection with the illustrative embodiment of the invention, however, it must be understood that these particular arrangements may merely illustrate, and that the invention is to be given its fullest interpretation.

The invention claimed is:

1. An electrical apparatus for use with a vehicle, the electrical apparatus comprising
a housing formed to include a cavity,
electronic circuitry positioned within the cavity of the housing, the electronic circuitry including integrated components coupled to a circuit board, and
a connector assembly coupled to the housing to cover an opening into the cavity, the connector assembly including at least one socket and at least one connector positioned within the at least one socket, the at least one connector being electrically coupled with the electronic circuitry,
wherein the at least one connector is configured to provide means for creating an electrical connection with an electrical plug that is received in the at least one socket to electrically couple components of the vehicle with the electronic circuitry and minimize a voltage loss across the electrical connection by minimizing electrical resistivity between the at least one connector and the plug, and
wherein the connector assembly further includes a cover plate coupled to the at least one connector, the cover plate being formed to include the at least one socket, and the cover plate and the at least one connector are integral.

2. The electrical apparatus of claim 1, wherein the at least one connector includes at least a portion that is substantially square in cross-section.

3. The electrical apparatus of claim 2, wherein corners of the substantially square cross-section are rounded.

4. The electrical apparatus of claim 3, wherein the at least one socket includes a first socket and a second socket spaced apart from the first socket, wherein the at least one connector includes three input connectors positioned within the first socket and two output connectors positioned within the second socket to form a bus bar, and wherein each of the input connectors and output connectors of the bus bar are electrically coupled with the electronic circuitry.

5. The electrical apparatus of claim 4, wherein the integrated components form a combined voltage regulator and voltage rectifier circuit.

6. The electrical apparatus of claim 5, wherein the input connectors are configured to receive alternating current supplied by the vehicle, the electronic circuitry is configured to convert the received alternating current into direct current within a predetermined voltage range, and the output connectors are configured to supply the direct current from the electronic circuitry to the vehicle.

7. The electrical apparatus of claim 3, wherein the at least one connector is stamped from a sheet of electrically conductive material and shaped to form the substantially square cross-section.

8. The electrical apparatus of claim 1, further comprising a lock member coupled to the connector assembly and associated with the at least one socket, the lock member being rotatable relative to the at least one socket.

9. The electrical apparatus of claim 8, wherein the lock member includes a pair of lock fingers configured to grip the plug positioned within the at least one socket to retain the plug within the at least one socket.

10. The electrical apparatus of claim 9, wherein the lock member is coupled to the connector assembly by a living hinge.

11. The electrical apparatus of claim 10, wherein the lock member and associated living hinge are integral with the connector assembly.

12. The electrical apparatus of claim 9, wherein the lock member further includes a pair of pivot arms, the pivot arms configured to pivotally attach the lock member with the connector assembly and allow rotation of the lock member about an axis of rotation.

13. The electrical apparatus of claim 12, wherein the lock member further includes a lock tab, the lock tab configured to engage with a portion of the connector assembly to maintain a rotational position of the lock member relative to the at least one socket.

14. The electrical apparatus of claim 12, wherein the pivot arms are coupled to the lock fingers and extend in a first direction away from the lock fingers, and wherein the lock member further includes a wall coupled to the lock fingers and extends in a second direction away from the lock fingers opposite the first direction.

15. An electrical apparatus for use with a vehicle, the electrical apparatus comprising
a metallic housing formed to include a cavity and a plurality of heat-sink fins configured to dissipate heat from the metallic housing,
electronic circuitry positioned within the cavity of the housing, the electronic circuitry including integrated components coupled to a circuit board, the integrated components forming a combined voltage regulator and voltage rectifier circuit, and
a connector assembly positioned to cover an opening into the cavity and engage the metallic housing to seal the cavity, the connector assembly including a first socket, a second socket spaced apart from the first socket, and a bus bar, the bus bar including three input connectors positioned within the first socket and two output connectors positioned within the second socket, the input connectors and output connectors being electrically coupled with the electronic circuitry, wherein each of the input connectors and output connectors include at least a portion that is substantially square in cross-section and having corners that are rounded, and a lock member coupled to the connector assembly and associated with the first socket, the lock member being rotatable relative to the first socket.

16. An electrical apparatus for use with a vehicle, the electrical apparatus comprising a housing formed to include a cavity, electronic circuitry positioned within the cavity of the housing, a connector assembly coupled to the housing to cover an opening into the cavity, the connector assembly including at least one socket and at least one connector positioned within the at least one socket, the at least one connector being electrically coupled with the electronic circuitry, wherein the at least one connector is configured to provide means for creating an electrical connection with an electrical plug that is received in the at least one socket to electrically couple components of the vehicle with the electronic circuitry, and a lock member coupled to the connector assembly and associated with the first socket, the lock member being rotatable relative to the first socket.

* * * * *